US008413094B2

(12) United States Patent
Abadeer

(10) Patent No.: US 8,413,094 B2
(45) Date of Patent: Apr. 2, 2013

(54) STRUCTURE, DESIGN STRUCTURE AND PROCESS FOR INCREASING MAGNITUDE OF DEVICE THRESHOLD VOLTAGE FOR LOW POWER APPLICATIONS

(75) Inventors: Wagdi W. Abadeer, Jericho, VT (US); Lilian Kamal, legal representative, Saratoga, CA (US)

(73) Assignee: International Business Machines Corporation, Armonk, NY (US)

(*) Notice: Subject to any disclaimer, the term of this patent is extended or adjusted under 35 U.S.C. 154(b) by 100 days.

(21) Appl. No.: 12/897,983

(22) Filed: Oct. 5, 2010

(65) Prior Publication Data

US 2012/0084741 A1 Apr. 5, 2012

(51) Int. Cl.
*G06F 17/50* (2006.01)
*H03K 19/003* (2006.01)
*H03K 19/23* (2006.01)
*H01L 25/00* (2006.01)
*H01L 29/76* (2006.01)

(52) U.S. Cl. ........ 716/111; 716/122; 716/123; 716/128; 716/129; 716/131; 716/136; 703/16; 326/9; 326/36; 326/47; 326/41; 326/101; 257/314

(58) Field of Classification Search ................... 716/111, 716/122, 123, 128, 129, 130, 131, 136; 703/16; 326/9, 36, 47, 41, 101; 257/314
See application file for complete search history.

(56) References Cited

U.S. PATENT DOCUMENTS

| 5,744,838 | A * | 4/1998 | Matsuo et al. | 257/356 |
|---|---|---|---|---|
| 6,407,433 | B1 * | 6/2002 | Wang et al. | 257/356 |
| 6,978,437 | B1 * | 12/2005 | Rittman et al. | 257/659 |
| 7,302,663 | B1 * | 11/2007 | Gan et al. | 716/112 |
| 2003/0114015 | A1 * | 6/2003 | Tokashiki | 438/746 |
| 2004/0189350 | A1 * | 9/2004 | Morimoto et al. | 327/65 |
| 2007/0171081 | A1 * | 7/2007 | Dixon et al. | 340/572.8 |
| 2009/0108831 | A1 * | 4/2009 | Levon et al. | 324/71.5 |
| 2010/0187590 | A1 * | 7/2010 | Ishigaki | 257/314 |
| 2010/0216300 | A1 * | 8/2010 | Ueda et al. | 438/585 |

FOREIGN PATENT DOCUMENTS

JP  2009118292 A  * 5/2009

OTHER PUBLICATIONS

Krishnan et al., "Inductively Coupled Plasma (ICP) Metal Etch Damage to 35-60A gate oxide", International Electron Devices Meeting, Dec. 8-11, 1996, pp. 731-734.*
Cheung, "A New Method to Monitor Gate-Oxide Reliability Degradation", Digest of Technical Papers, 1995 Symposium on VLSI Technology, Jun. 6-8, 1995, pp. 83-84.
Mistry, et at.; "Effect of Plasma-Induced Charging Damage on n-Channel and p-Channel MOSFET Hot Carrier Reliability"; Proceeding of the 1994 International Reliability Physics Symposium, Apr. 11-14, 1994. pp. 42-47.
Rangan et al., "A Model for Channel Hot Carrier Reliability Degradation Due to Plasma Damage in MOS Devices", Proceeding of the 1999 Int'l Reliability Physics Symposium, Mar. 23-25, 1999, pp. 370-374.
Weng et al., "A Comprehensive Model for Plasma Damage Enhanced Transistor Reliability Degradation", Proceeding of the 2007 International Reliability Physics Symposium; Apr. 15-19, 2007; pp. 364-369.

* cited by examiner

*Primary Examiner* — Phallaka Kik
(74) *Attorney, Agent, or Firm* — Michael LeStrange; Roberts Mlotkowski Safran & Cole, P.C.

(57) ABSTRACT

A method of increasing an initial threshold voltage (Vt) of selected devices. The method includes designing devices with desired antenna effects and adjusting an increase in Vt of some devices to specific values. The desired antenna effects produce a desired threshold voltage of the devices.

23 Claims, 3 Drawing Sheets

STRUCTURE, DESIGN STRUCTURE AND PROCESS FOR INCREASING MAGNITUDE OF DEVICE THRESHOLD VOLTAGE FOR LOW POWER APPLICATIONS

FIELD OF THE INVENTION

The invention generally relates to a layout of devices in such a way to accomplish desired antenna effects, which in turns produces a desired threshold voltage of these devices, and such that no additional processing implants or mask levels are necessary.

BACKGROUND

For many applications, such as low power, e.g., in the range of less than 0.1 Watts, it is desirable to increase the magnitude of threshold voltage (Vt) for devices such as nFETs and pFETs. Doing so leads to a decrease of about 10× in sub-threshold leakage for every 80 mV increase in threshold voltage, and thus reduction of power by several orders of magnitude in stand-by situations. In sealed CMOS technologies, this could be a significant part of the overall power dissipation of the chip. Increasing the magnitude of Vt requires additional implant levels, and thus this procedure is applied to increase magnitude of Vt by only a certain fixed amount. However, this cannot be easily accomplished without increasing processing costs associated with obtaining several values of increased threshold voltage.

In conventional methods, increasing the magnitude of device threshold voltage requires additional processing steps in terms of implants and mask levels so that the threshold voltage of a device can be controlled to the desired value.

Accordingly, there exists a need in the art to overcome the deficiencies and limitations described hereinabove.

SUMMARY

In a first aspect of the invention, there is provided a method of increasing an initial threshold voltage (Vt) of selected devices. The method includes designing devices with desired antenna effects and adjusting an increase in Vt of some devices to specific values. The desired antenna effects produce a desired threshold voltage of the devices.

In a second aspect of the invention, there is provided a method of increasing an initial threshold voltage (Vt) of selected devices. The method includes designing devices with different antenna effects and increasing Vt of some devices to specific values based on the antenna effects.

In a third aspect of the invention, there is provided a design structure embodied in a machine readable medium for designing, manufacturing, or testing an integrated circuit having selected devices with an initial threshold voltage (Vt). The design structure comprises devices with different antenna effects and other devices with different antenna effects on different wiring levels. Antenna effects of some of the devices are changed in order to increase Vt of selected devices to specific values.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
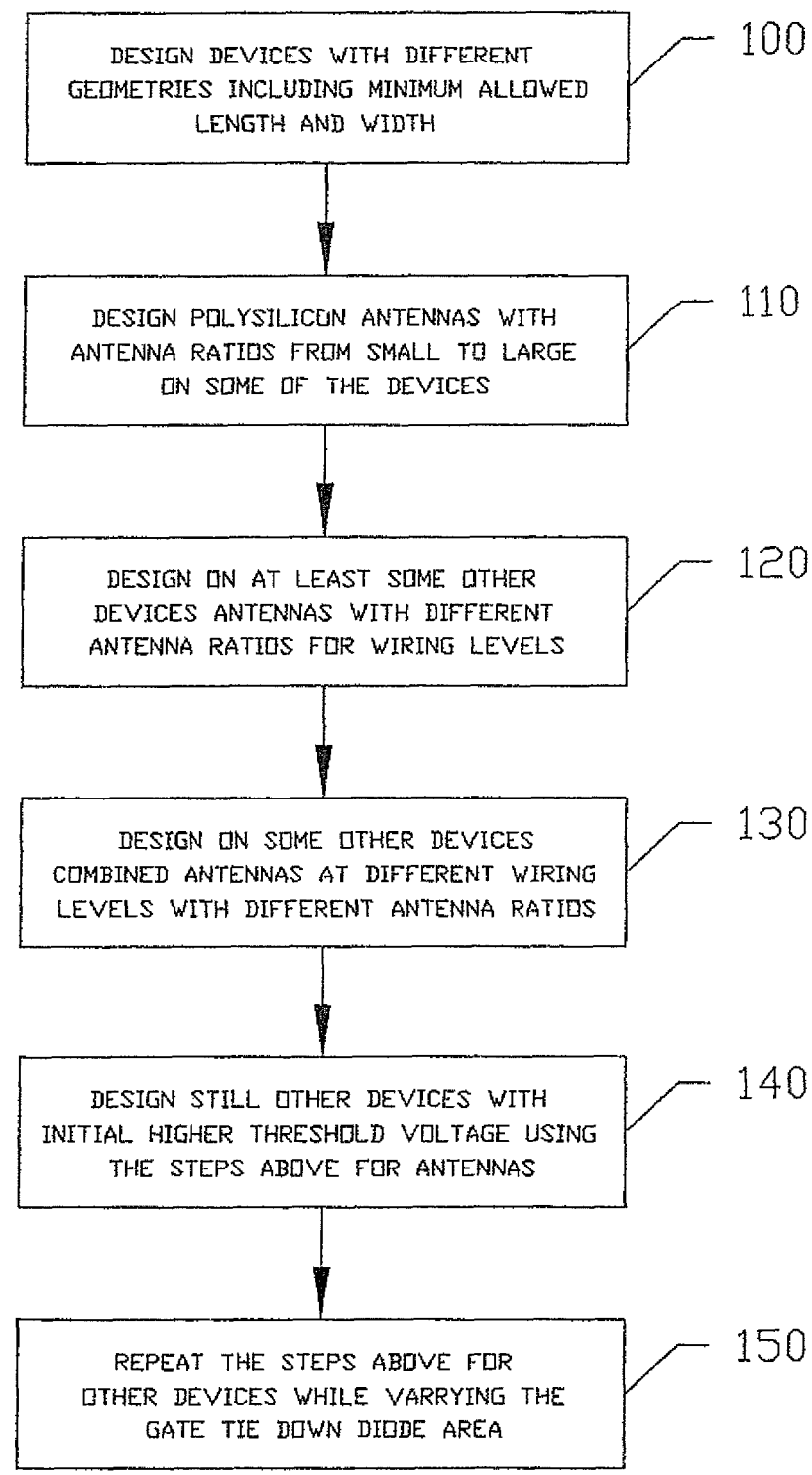
FIG. 1 shows a flowchart illustrating a process for designing test structures.

The invention generally relates to a layout of devices in such a way to accomplish desired antenna effects, which in turns produces a desired threshold voltage of these devices, and such that no additional processing implants or mask levels are necessary.

It is desirable to be able to tune Vt to different values, e.g., in the range of between about 0.3V to about 0.8V, for devices in different circuits so that each value of higher Vt, e.g., higher than about 0.3V, best suits the function of a particular circuit. It is also desirable to achieve this advantage without additional processing steps or additional mask levels.

In the present invention, no additional processing implants or mask levels are necessary to achieve the tunability of Vt. Instead, the layout of the devices such as nFETs and pFETs is done in such a way to accomplish the desired antenna effects. One desired effect relates to increasing fixed charge (such as electrons trapped in gate oxide) which in turn increases magnitude of threshold voltage. This, in turn, produces the desired threshold voltage of these devices.

The invention is also directed to a method of increasing an initial threshold voltage (Vt) of selected devices by up to about 0.5V wherein the method includes designing devices, i.e., nFETs and pFETs, with desired antenna effects, and adjusting an increase in Vt of some devices to specific values. The desired antenna effects produce a desired threshold voltage of the devices.

The invention is also directed to a method of increasing an initial threshold voltage (Vt) of selected devices wherein the method includes designing devices with different antenna effects and increasing Vt of some devices to specific values based on the antenna effects. The invention is also directed to a method of increasing an initial threshold voltage (Vt) of selected devices wherein the method includes designing devices with different antenna effects, designing other devices with different antenna effects on different wiring levels, and changing antenna effects of some of the devices in order to increase Vt of selected devices to specific values.

FETs with a gate oxide thickness of about 5 nm and higher exhibit certain characteristics in regard to antenna charging effects. Under antenna charging effects, these devices exhibit resilience to degradation in breakdown characteristics, but can exhibit an increase in magnitude of threshold voltage after processing. They can also suffer from an increase degradation under hot carriers and NBTI (negative bias temperature instability) during normal operation. For many applications, such as low power, i.e., of up to about 0.1 Watts, and other applications, the device drain-to-source voltage (during normal operation) is less than the full Vdd value, e.g., in case of a resistance series with device. Also, in many applications, pFETs are not subject to NBTI stress under worst case power supply conditions. An example is when one diffusion is at some non-zero voltage. The invention aims to tailor the Vt for devices in the above-noted applications by designing antenna ratios of the devices at certain processing levels to increase the final Vt value by a desired amount and with reasonable limits.

FIG. 1 illustrates steps utilized to arrive at the design layout conditions of the devices and the chip. The steps of FIG. 1 may be implemented on any known computer infrastructure. The flowchart and/or block diagram in the Figures illustrates the architecture, functionality, and operation of possible implementations of systems, methods and computer program products according to various embodiments of the present invention. In this regard, each block in the flowchart or block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the flowchart, and combinations of the flowchart illustrations can be implemented by special purpose hardware-based systems that perform the specified functions or acts, or combinations of special purpose hardware and computer instructions and/or software, as described above.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following:

a portable computer diskette,
a hard disk,
a random access memory (RAM),
a read-only memory (ROM),
an erasable programmable read-only memory (EPROM or Flash memory),
a portable compact disc read-only memory (CDROM),
an optical storage device, and/or The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

In the context of this document, a computer-usable or computer-readable medium may be any medium that can contain, store, communicate, propagate, or transport the program for use by or in connection with the instruction execution system, apparatus, or device. The computer usable program code may be transmitted using any appropriate transmission media via a network.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network. This may include, for example, a local area network (LAN) or a wide area network (WAN), or the connection may be made to an external computer (for example, through the Internet using an Internet Service Provider).

Again, with reference to FIG. 1, the design process utilizes some selected devices that can have adjustable initial Vt's and that meet reliability objectives at normal chip operating conditions. The layout conditions include, among other things, design to specific antenna rules for certain devices that are desired to have adjustable initial Vt's. Also, these devices, according to their specific operating conditions, need not experience full Vdd supply voltage for drain-to-source voltage, and/or may not experience the full Vdd drop across the gate oxide, which is important for NBTI degradation. Also, the circuits in which these devices are part of may tolerate a certain amount of hot carrier or NBTI degradation. Thus, according to the operating conditions of these selected devices, and their circuits, either some level of hot carrier or NBTI degradation could be tolerated by the circuits. Alternatively, the devices need not be subject to full stresses for hot carriers or NBTI during normal operating conditions of the chip.

In FIG. 1, the steps to arrive at the appropriate device layout conditions utilize a process or procedure that designs on a test site several devices in order to access the process effects associated with some specific antenna ratio ground rules. Devices are designed on the test site where the nFETs and pFETs are of different geometries covering minimum allowed dimensions. A sub-set of the devices are designed with different polysilicon antenna ratios. These ratios cover the range from small antenna ratios, e.g., of above one, to fairly large ones, e.g., of up to about 200 or even more. Another sub-set of nFETs and pFETs are designed with different antenna ratios for levels above the polysilicon. These levels include the following: 1st metal, 1st via, 1st contact, 2nd metal, 2nd via, etc. Still another group of devices are designed with different antenna ratios that combine different levels, for example, polysilicon and M1 combined antennas, and/or M1 and M2, and so on. The devices with various antenna layout conditions could also have different sizes for the gate tie down protect diodes for the nFETs and the pFETs. The design procedure can also include regular nFETs and pFETs utilizing normal Vt values, as well devices designed and processed to have higher Vt's by adjusting one or more specific implant conditions.

The detailed steps of FIG. 1 will now be described. The procedure or process begins with test site design step 100 in which devices, such as nFETs and pFETS, are designed with different geometries including minimum allowed length and width, i.e., area. This design step can take place using, e.g., automated design tools which are well known in the art. In step 110, polysilicon antennas are designed on some of the devices. The antennas are designed with different antenna ratios which can preferably range from small ratios, e.g., of about one, to large ratios, e.g., of up to about 200 or more. Next, in step 120, polysilicon antennas are designed on some of the other devices. The antennas are designed with different antenna ratios ranging from about one to about 200 or more for different wiring levels. In step 130, combined antennas are designed on still other devices wherein the antennas are designed for different wiring levels and with different antenna ratios ranging from about one to about 200 or more. Next, in step 140, still other devices are designed for antennas such that the devices have an initial higher threshold voltage Vt ranging from about 0.3V to about 0.5V utilizing the above steps 100-130. Finally, in step 150, steps 100-140 are repeated for still other devices while varying a gate tie down diode area. The gate tie down area can preferably range from small areas to large areas, i.e., ranging from about a fraction of square microns to 10 square microns.

Figure 2:
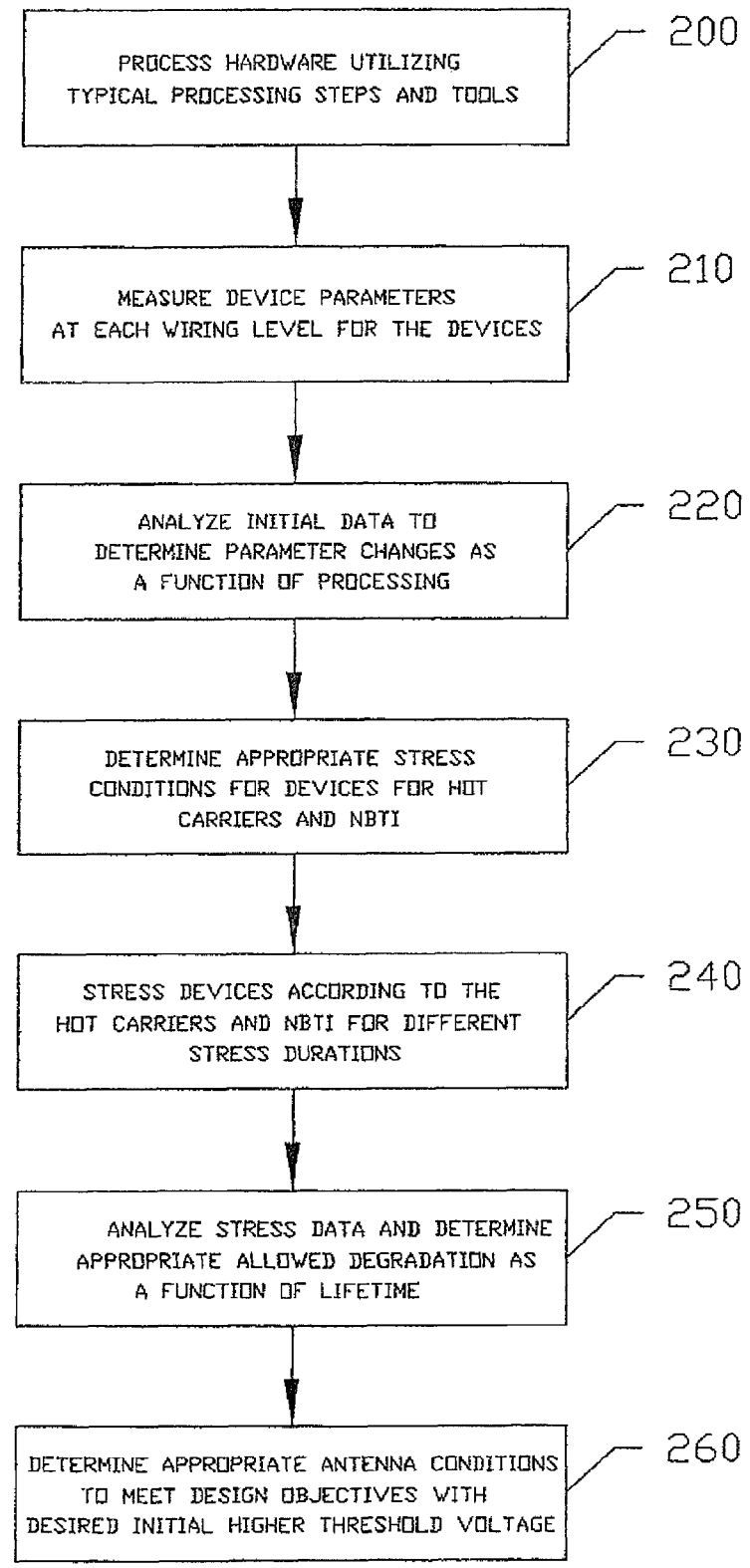
FIG. 2 shows a flowchart illustrating a process for evaluating selection of design conditions of FIG. 1.

FIG. 2 illustrates a procedure for evaluating the devices designed above (i.e., devices designed on a test site) in order to arrive at the appropriate antenna rules for the selected devices on the product chip that will have an adjusted higher initial Vt. All of the devices designed with different antenna ratios are initially measured for the as-processed device parameters in both linear and saturation modes, such as threshold voltage with drain to source voltage equal to supply voltage (Vtsat), threshold voltage with drain to source voltage equal to about 0.1V (Vtlin), device current with drain to source voltage equal to supply voltage (Idsat), device current with drain to source voltage equal to about 0.1 V (Idlin), and device transconductance at gate to source voltage and drain to source voltage equal to supply voltage (Gm). The device measurements are taken at different relevant process steps to evaluate the effect of the specific antennas designed with the devices. From these measurements, the antenna layout conditions that give the desired amount of increase in initial Vt's are determined. The procedure can also utilize several combinations of antenna layout rules which provide the desired increase in Vt. After initial measurements are completed, appropriate stress conditions are determined for hot carriers and NBTI for both nFETs and pFETs. Preferably, the devices are stressed in different groups, to different stress durations and conditions according to industry standards given in JEDEC documents, to both hot carriers and NBTI mechanisms. Using the stress results, the antenna layout conditions that meet reliability operating conditions on the chip are determined. From this group, a sub-set of devices that also meet the desired increase in initial Vt's are determined. This sub-set will then provide the antenna layout conditions that meet the design performance and reliability objectives.

The detailed steps of FIG. 2 will now be described. The procedure or process begins with test lab manufacturing process step 200 in which semiconductor structures having devices, such as nFETs and pFETS, are produced utilizing typical processing steps and tools. In step 210, device parameters, e.g., Vtsat, Vtlin, Idsat, Idlin, and Gm, are measure and recorded for each wiring level. Next, in step 220, initial data obtained in step 210 is analyzed, e.g., using automated test analysis techniques well known in the art, to determine parameter changes (and specifically changes in the following parameters e.g., Vtsat, Vtlin, Idsat, Idlin, and Gm) as a function of processing for each wiring level. In step 230, appropriate, i.e., non-destructive and safe stress conditions are determined by employing some initial device measurements and characterizing techniques for the devices for hot carriers and NBTI. This step evaluates the reliability of the devices. Next, in step 240, the devices are stressed according to the hot carriers and NBTI for different stress durations according to industry standards given in JEDEC documents. In step 250, the stress data is analyzed, e.g., using automated test analysis techniques well known in the art, to determine an appropriate allowed degradation as determined by design and product operating requirements and engineering specifications as a function of lifetime. Finally, in step 260, appropriate antenna conditions are determined as meeting product reliability requirements and specifications, and to meet design objectives with desired initial higher threshold voltage Vt. The design in FIG. 1 is then modified based on the results obtained in FIG. 2 in order to finalize the circuit design.

The method as described above is used in the fabrication of integrated circuit chips. The resulting integrated circuit chips can be distributed by the fabricator in raw wafer form. (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

DESIGN FLOW

Figure 3:
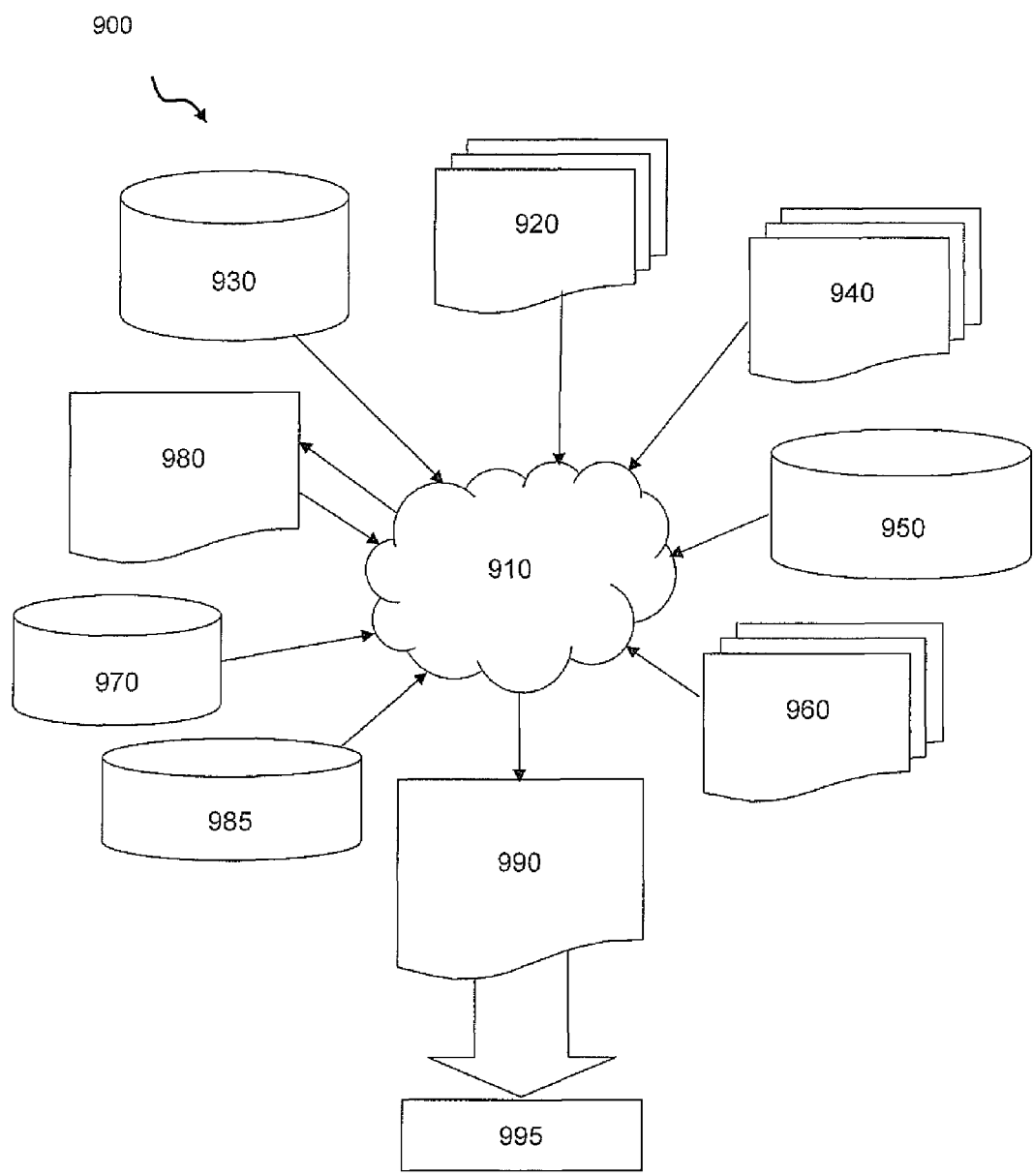
FIG. 3 is a flow diagram of a design process used in semiconductor design, manufacturing, and/or testing.

FIG. 3 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. (Altera is a registered trademark of Altera Corporation in the United States, other countries, or both. Xilinx is a registered trademark of Xilinx, Inc. in the United States, other countries, or both.) Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1 and 2 in the form of schematics or HDL, a hardware-description language (e.g., VERILOG®, Very High Speed Integrated Circuit (VHSIC) Hardware Description Language (VHDL), C, etc.). (VERILOG is a registered trademark of Cadence Design Systems, Inc. in the United States, other countries, or both.) Design structure 920 may be contained on one or more machine readable medium. For example, design structure 920 may be a text file or a graphical representation of an embodiment of the invention as shown in FIGS. 1 and 2. Design process 910 preferably synthesizes (or translates) an embodiment of the invention as shown in FIGS. 1 and 2 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1 and 2, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention produced by the processes shown in FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of increasing an initial threshold voltage (Vt) of selected devices, comprising:

designing devices with desired antenna effects;
adjusting an increase in Vt of some devices to specific values; and
meeting reliability objectives for hot carriers and negative bias temperature instability (NBTI) utilizing specific antenna rules, wherein:
the desired antenna effects produce a desired threshold voltage of the devices; and
at least one of the designing the devices and the adjusting an increase in Vt of some devices is performed using a computing device.

2. The method of claim 1, wherein the method eliminates different process implant conditions and/or special mask levels.

3. The method of claim 1, wherein the selected devices are arranged on a product chip.

4. The method of claim 1, wherein the selected devices comprise one of nFETs and pFETs.

5. The method of claim 1, wherein the selected devices have a predetermined or desired level of gate dielectric reliability for oxide breakdown.

6. The method of claim 1, wherein the designing comprises designing specific types of antennas with certain values of antenna ratios in order to achieve a desired increase in Vt for the selected devices.

7. The method of claim 1, wherein the meeting reliability objectives for hot carriers and NBTI utilizing specific antenna rules is performed under operating conditions.

8. The method of claim 1, wherein the selected devices each have a specific antenna layout condition and a specific area for tie down protect diodes.

9. The method of claim 1, further comprising utilizing other devices with different Vt.

10. The method of claim 1, wherein the designing devices with desired antenna affects comprises:
designing a first subset of the devices with different polysilicon antenna ratios; and
designing a second subset of the devices with different antenna ratios for levels above the first subset of devices.

11. The method of claim 10, wherein the designing devices with desired antenna affects further comprises designing a third subset of the devices with different antenna ratios combing different levels.

12. The method of claim 11, further comprising:
measuring device parameters of the devices with the different antenna ratios in linear and saturation modes; and
determining antenna layout conditions which provide a desired amount of increase in the Vt.

13. A method of increasing an initial threshold voltage (Vt) of selected devices, comprising:
designing devices with different antenna effects;
increasing Vt of some devices of the devices to specific values based on the antenna effects; and
meeting reliability objectives for hot carriers and negative bias temperature instability (NBTI) utilizing specific antenna rules, wherein at least one of the designing the devices and the increasing in the Vt of some devices is performed using a computing device.

14. The method of claim 13, wherein the method eliminates different process implant conditions and/or special mask levels.

15. The method of claim 13, wherein the devices are arranged on a product chip.

16. The method of claim 13, wherein the devices comprise one of nFETs and pFETs.

17. The method of claim 13, wherein the devices have a predetermined or desired level of gate dielectric reliability for oxide breakdown.

18. The method of claim 13, wherein the designing comprises designing specific types of antennas with certain values of antenna ratios in order to achieve a desired increase in Vt for selected devices.

19. The method of claim 13, wherein the devices each have a specific antenna layout condition and a specific area for tie down protect diodes.

20. The method of claim 13, wherein the designing devices with different antenna affects comprises:
   designing a first subset of the devices with different polysilicon antenna ratios; and
   designing a second subset of the devices with different antenna ratios for levels above the first subset of devices.

21. The method of claim 20, further comprising:
   measuring device parameters of the devices with the different antenna ratios in linear and saturation modes; and
   determining antenna layout conditions which provide a desired amount of increase in the Vt, wherein the designing devices with different antenna affects further comprises designing a third subset of the devices with different antenna ratios combing different levels.

22. A design process for designing, manufacturing, or testing an integrated circuit in a computing device, wherein the design process comprises translating inputs into a design structure embodied in a machine readable storage medium utilized by the computing device, the design structure comprising:
   devices with different antenna effects; and
   other devices with different antenna effects on different wiring levels,
   wherein antenna effects of some of the devices are changed in order to increase Vt of selected devices to specific values and to meet reliability objectives for hot carriers and negative bias temperature instability (NBTI) utilizing specific antenna rules.

23. The design process of claim 22, wherein at least one of:
   the design structure comprises a netlist;
   the design structure resides on storage medium as a data format used for the exchange of layout data of integrated circuits; and
   the design structure resides in a programmable gate array.

* * * * *